United States Patent [19]
Gutsche et al.

[11] Patent Number: 6,033,977
[45] Date of Patent: *Mar. 7, 2000

[54] DUAL DAMASCENE STRUCTURE

[75] Inventors: Martin Gutsche, Poughkeepsie; Dirk Tobben, Fishkill, both of N.Y.

[73] Assignee: Siemens Aktiengesellschaft, Munich, Germany

[*] Notice: This patent issued on a continued prosecution application filed under 37 CFR 1.53(d), and is subject to the twenty year patent term provisions of 35 U.S.C. 154(a)(2).

[21] Appl. No.: 08/884,729

[22] Filed: Jun. 30, 1997

[51] Int. Cl.⁷ .................................................. H01L 21/4763
[52] U.S. Cl. ........................ 438/618; 438/637; 438/700; 430/618
[58] Field of Search .................... 438/618, 626, 438/624, 637, 700, 701, 702, 640; 257/773; 430/618

[56] References Cited

U.S. PATENT DOCUMENTS

| | | | |
|---|---|---|---|
| 4,523,372 | 6/1985 | Balda et al. | 438/623 |
| 5,158,910 | 10/1992 | Cooper et al. . | |
| 5,422,309 | 6/1995 | Zettler et al. | 437/192 |
| 5,529,953 | 6/1996 | Shoda | 437/189 |
| 5,602,423 | 2/1997 | Jain | 257/752 |
| 5,614,765 | 3/1997 | Avanzino et al. | 257/774 |
| 5,705,430 | 1/1998 | Avanzino et al. . | |
| 5,710,061 | 1/1998 | Cleeves . | |
| 5,801,099 | 9/1998 | Kim et al. . | |

*Primary Examiner*—Caridad Everhart
*Attorney, Agent, or Firm*—Stanton C. Braden

[57] ABSTRACT

A method for manufacturing a dual damascene structure includes the use of a sacrificial stud and provides an improved defined edge on the interface between the conductive line openings and the via openings.

6 Claims, 2 Drawing Sheets

DUAL DAMASCENE STRUCTURE

BACKGROUND

1. Technical Field

The invention relates to semiconductor manufacturing and, more particularly, to the formation of a dual damascene structure.

2. Background of Related Art

Generally, semiconductor devices include a plurality of circuits which form an integrated circuit. Integrated circuits can be useful for computers and electronic equipment and may contain millions of transistors and other circuit elements that can be fabricated on a single silicon crystal semiconductor device, i.e., chip. For the device to be functional, a complex network of signal paths will normally be routed to connect the circuit elements distributed on the surface of the device. Efficient routing of these signals across the device becomes more difficult as the complexity of the integrated circuit is increased. Thus, multi-level or multi-layered schemes known as dual damascene structures are desirable due to their ability to increase the device's density and, therefore, allow stacked interconnected levels of a densely packed semiconductor device.

When fabricating integrated circuits with a dual damascene structure, an insulating or dielectric material such as silicon oxide of a semiconductor device will normally be patterned with, for example, several thousand openings to create conductive line openings and via openings. The conductive line and via openings can then be filled with a conductive metal layer, e.g., aluminum, to interconnect the active and/or passive elements of the integrated circuits. The dual damascene structure may also be used for forming multilevel conductive lines of metal, e.g., copper, in insulating layers, e.g., polyimide, of multi-layer substrates on which semiconductor devices can be mounted.

Methods for manufacturing a dual damascene structure are known. See, e.g., U.S. Pat. Nos. 5,422,309; 5,529,953; 5,602,423; and 5,614,765. Generally, a standard dual damascene structure can be manufactured by first coating an insulating layer with a antireflective coating (ARC) and photoresist layers. The photoresist is then exposed through a first mask with an image pattern of via openings and the pattern can be anisotropically etched through insulating layer to expose the underlying conductive layer. After etching the via openings, the remaining ARC and photoresist are removed. New layers of ARC and photoresist are then deposited. The resist is exposed through a second mask with an image pattern of the conductive line openings. The second image pattern will typically be aligned with the first mask pattern to encompass the via openings with the conductive line openings. The portions of the resist where the conductive line openings are to be formed are removed, exposing the via opening and insulating layer. The exposed insulating layer is then etched to a desired depth equal to the height of the conductive line. When the etching is complete, both the via openings and the conductive line openings may be filled with a conductive metal layer.

The second deposition of ARC and photoresist layers fills the vias with ARC, causing polymer to build-up in the vias during the subsequent etch that forms the conductive line openings. As groundrules become smaller and smaller, such polymer build-up leads the formation of $SiO_2$ fences at the interface of the via and conductive line openings. The presence of fences disrupts the flow of metal into the vias, causing voids to form therein. Such voids result in increase via resistance and, in some cases, via failures.

From the above discussion, there is a need to provide a dual damascene structure without the formation of fences at the via-line openings.

SUMMARY OF THE INVENTION

Novel methods for manufacturing a dual damascene structure have been discovered which include the steps of forming a sacrificial material layer on a semiconductor substrate; forming an intermetal dielectric layer onto the semiconductor substrate; etching conductive line openings in the intermetal dielectric layer and removing the sacrificial material layer.

In a particular useful embodiment, the method includes the steps of:

a) forming a sacrificial material layer on at least a portion of a semiconductor substrate;

b) patterning the sacrificial material layer into at least one stud;

c) forming an intermetal dielectric layer on at least a portion of the semiconductor substrate;

d) etching at least one conductive line opening in the intermetal dielectric layer;

e) removing at least one stud from the intermetal dielectric layer; and f) replacing at least one stud in the intermetal dielectric layer with a conductive material.

BRIEF DESCRIPTION OF THE DRAWINGS

A preferred embodiment of a method for manufacturing a dual damascene structure is described below with reference to the drawings wherein.

DESCRIPTION OF THE PREFERRED EMBODIMENTS

The invention relates to the fabrication of integrated circuits (ICs). Such ICs include memory circuits like, for example, random access memories (RAMs), dynamic RAMs (DRAMs), synchronous DRAMs (SDRAMs), static RAMs (SRAMs), and read only memories (ROMs). Other ICs include logic devices such as programmable logic arrays (PLAs), application specific ICs (ASICs), or any circuit devices. The invention provides for a dual damascene structure substantially free of poorly defined edges at the interface of the conductive line and via openings. Typically, a plurality of ICs are fabricated on a semiconductor substrate, such as a silicon wafer, in parallel. After processing, the wafer is diced in order to separate the ICs into a plurality of individual chips. The chips are then packaged into final products for use in, for example, consumer products such as computer systems, cellular phones, personal digital assistants (PDAs), and other products.

In one embodiment, the invention includes the use of a sacrificial material in conjunction with a dielectric material in which the dual damascene structure is formed. The layer in which the dual damascene structure is formed is herein referred to as the intermetal dielectric (IMD). The poorly defined edges are avoided by choosing a sacrificial material which has a higher wet or dry etch rate compared to the IMD.

Figure 1:
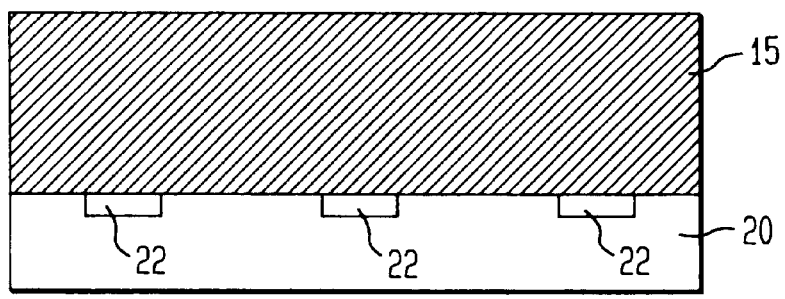
FIG. 1 is a cross-sectional view of the sacrificial material layer formed on the semiconductor substrate.

Referring to FIG. 1, a portion of a semiconductor substrate 20 is provided. The substrate, for example, comprises a silicon wafer. Other substrates, such as gallium arenide, silicon on insulator (SOI), germanium, or other semiconductor materials are also useful. The substrate 20 includes ICs (not shown) formed thereon. The ICs can be at any stage of processing. Included on the substrate are underlying conductive regions 22 such as metallization layers. Alternatively, conductive regions are highly doped polysilicon layers or any portion of an active device, such as a source or drain region of a transistor. In one embodiment, the conductive regions represent bitlines of a DRAM chip. The conductive regions are isolated by, for example, a dielectric material. Typically, the top surface 30 is planarized to provide a planar top surface. The ICs can include additional devices, circuitry, and other interconnection levels.

As shown, a sacrificial material layer 15 is formed on semiconductor substrate 20 above surface 30. Suitable material for sacrificial material layer 15 includes any conventional material known to one skilled in the art. In one embodiment, materials that are employed to form the layer 15 include flowable oxide, CVD oxide, BSG, SiN, non-silicon containing materials such as parylene, polyimide (e.g. photosensitive polyimides) and PB0 and the like. It is highly advantageous that the sacrificial materials used in the method described herein have a substantially greater wet and/or dry etch rate than the IMD layer subsequently formed on semiconductor substrate 20 as described herein below.

To achieve suitable uniformity of thickness, sacrificial material layer 15 will normally be substantially planarized. If necessary, a separate planarization step such as, for example, CMP can be employed. Typically, the thickness of the sacrificial material layer 15 formed on semiconductor substrate 20 will ordinarily be at least equal to or greater than the expected height of the via openings formed in accordance with the methods described herein. The thickness of sacrificial material layer 15 can range from about 1,000 Å to about 10,000 Å, preferably from about 1,000 Å to about 8,000 Å, and more preferably from about 3,000 Å to about 6,000 Å. Of course, the thickness can vary depending on design parameters.

Figure 2:
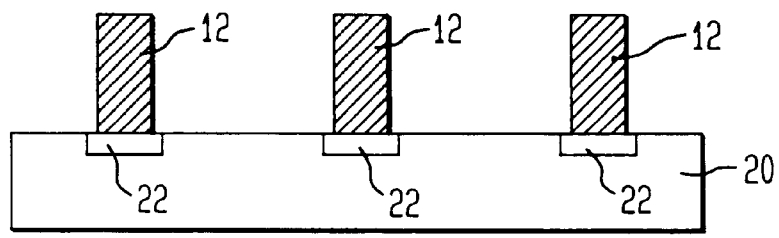
FIG. 2 is a cross-sectional view of the sacrificial material layer patterned into studs on the semiconductor substrate.

Referring to FIG. 2, the sacrificial layer is patterned to form at least one stud 12 where a via hole or opening is to be formed. In the exemplary portion of the substrate, three studs are formed. However, those skill in the art will understand that in the fabrication of ICs, a plurality of studs can be formed to contact underlying conductive regions. Patterning of the sacrificial layer includes, for example, depositing ARC and photoresist layers and selectively exposing the photoresist in regions except where studs are to be formed with an exposure source. The resist layer is developed, removing the exposed portions. The substrate is then etched anisotropically, by for example, reactive ion etching (RIE). Portions of the sacrificial layer unprotected by the resist are removed, leaving the studs corresponding to via locations that contact the conductive regions 22. Although positive resist is described, the use of negative resist is also useful.

Typically, the distance of the conductive layers and studs will normally vary according to the current-carrying requirements for a given conductor (the conductive material that will replace each stud 12 as described herein below), such that reliability problems, e.g., electromigration, may be avoided. Where low currents are expected, conductor size and spacing will be, however, limited to a minimum width specific to a given semiconductor device and/or semiconductor fabrication process. The width between each stud 12 will ordinarily range from about 0.15 microns ($\mu$m) to about 1.0 micron, preferably from about 0.15 $\mu$m to about 0.35 $\mu$m and more preferably from about 0.15 $\mu$m to about 0.25 $\mu$m.

Figure 3:
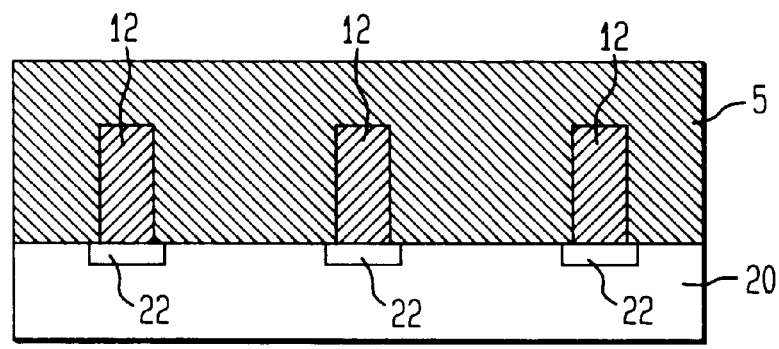
FIG. 3 is a cross-sectional view of the intermetal dielectric layer formed on the surface of the semiconductor substrate and over top surface of the studs.

Following the patterning of at least one stud 12, IMD layer 5 is formed on the surface of semiconductor substrate 20 and over the top surface of studs 12 (See FIG. 3). The IMD material used in the method described herein can include any suitable dielectric material known to those skilled in the art. In one embodiment, the IMD material includes A418 SOG, HSG-R7 SOG, organically doped CVD oxide, converted CVD oxide, silicon-containing, undoped silicate glass, organic material such as BCB or the like.

The IMD layer 5 can ordinarily be formed onto the surface of semiconductor substrate 20 and over the top surface of studs 12 as a substantially planarized layer. A substantially planarized layer can be achieved either directly through the formation process, e.g., in the case of spin on film, or by applying planarizing techniques, such as chemical-mechanical polishing (CMP), after the formation of the IMD layer. The thickness of the IMD is sufficient to accommodate the studs and the overlying conductive lines. The IMD, for example, has thickness that is greater than the height of the stud by h, where h is equal to about the height of the conductive lines. Of course, h depends on design parameters. Typically, the thickness of intermetal dielectric layer 5 will range from about 2,000 Å to about 20,000 Å, preferably from about 3,000 Å to about 12,000 Å and more preferably from about 4,000 Å to about 9,000 Å. Techniques for forming the intermetal dielectric layer 5 are within the purview of one skilled in the art.

Alternatively, the IMD layer is slightly less than or equal to about the thickness of the studs. After planarization, a second IMD layer is formed thereon. The thickness of the second IMD layer is typically equal to about the height of the conductive lines. The second IMD layer comprises a material which can be etched selectively to the first IMD layer. By providing a dual IMD layer, the first IMD layer serves as an etch stop for etch that forms the overlying conductive lines.

Figure 4:
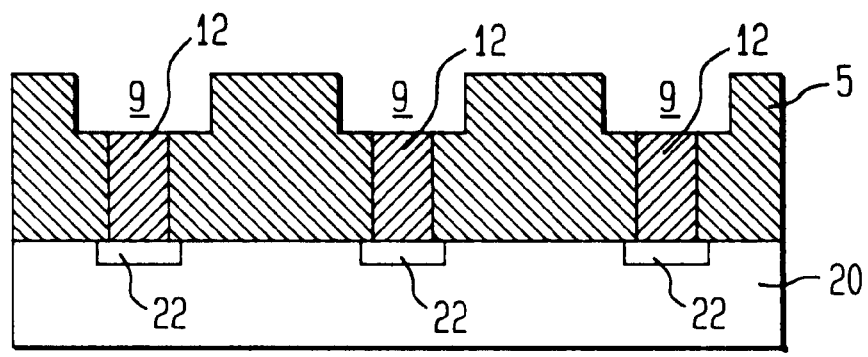
FIG. 4 is a cross-sectional view of the etched conductive line openings.

Referring to FIG. 4, the IMD layer is patterned to create the conductive line openings 9. Patterning of the conductive line openings is achieved using conventional lithographic and etch techniques. Such techniques include, for example, depositing ARC and photoresist layers and subsequently selectively exposing the resist layer with radiation, such as deep ultra-violet (DUV) or extreme ultra-violet (EUV), from an exposure source. Radiation of other wavelengths is also useful. Exposed regions of the resist layer are then removed during development to expose the IMD surface corresponding to line openings 9. A RIE is performed to create openings 9. The RIE is either terminated by time timed so as to etched sufficiently deep to reach the top of the stud or terminated with an etch stop technique when a dual IMD layer is used.

Figure 5:
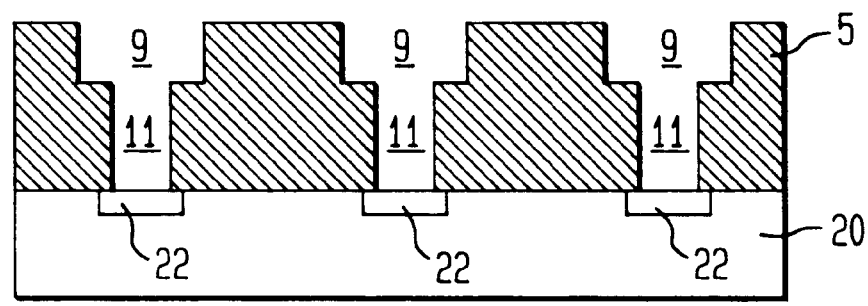
FIG. 5 is a cross-sectional view of the conductive line openings with the studs removed.

Next, each stud 12 is selectively removed from within the conductive line openings 9 by a wet or dry etching process to create via openings 11 as illustrated in FIG. 5. In accordance with the invention, the stud can be etched selectively to the IMD layer. The etch selectivity between the stud and IMD is sufficient to enable the removal of the stud without effectively removing the IMD layer. In one embodiment, the etch selectivity between the stud and IMD is about≧8:1, more preferably about≧12:1, even more preferably about>20:1. The parameters for creating via openings 11 (e.g., type of etchant, concentration of etchant, time, temperature, etc.) are within the purview of one skilled in the art. The choice of etchant depends on a number of factors including the composition of the stud. Suitable etchants include BHF, CDE, and oxygen. Table I lists illustrative combination of materials and type of etchant that can be used to remove the stud.

| Sacrificial Material | IMD | Etch |
|---|---|---|
| Flowable oxide (FOx) | A41B SOG | BHF |
| FOx | HSG-R7 SOG | BHF |
| Fox | organically doped CVD oxide | BHF |
| FOx | CVD oxide | BHF |
| CVD oxide | A418SOG | |
| CUD oxide | HSG-R7 SOG | BHF |
| BSG | A418 SOG | BHF |
| BSG | HSG-R7 SOG | |
| BSG | organically doped CVD oxide | BHF |
| BSG | conv. CVD oxide | BHF |
| SiN | CVD oxide | CDE |
| organic materials, non-Si containing (parylene, polyimides, PBO) | CVD oxide | oxygen |
| organic materials, non-Si containing (parylene, photosensitive polyimides, PBO) | Si-containing organic material (BCB) | oxygen |

Figure 6:
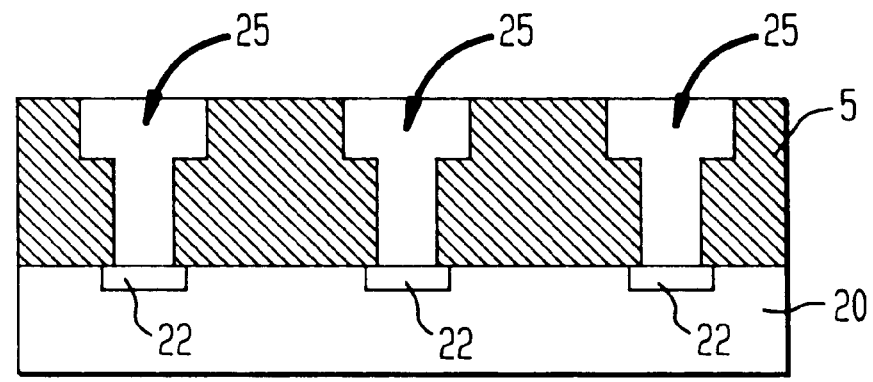
FIG. 6 is a cross-sectional view of the conductive line openings and the via openings filled with a conductive metal layer.

Following the formation of via opening 11, a conductive material 25 is deposited within and fills via opening 11 and conductive line opening 9 as shown in FIG. 6. Conductive material 25 may be formed by any known or conventional procedure, for example, by selective chemical vapor depositions (CVD's). Any conventional conductive material can be used herein. Suitable materials for forming conductive material 25 include but are not limited to Ti, TiN, TiW, W, Al, Cu, Pd and the like. Preferred materials include W and Al.

Although the invention has been described with reference to the above illustrative embodiments with a certain degree of particularity, changes and variations are possible therein will be apparent to those skilled in the art after reading the foregoing description. It is therefore to be understood that the present invention may be presented otherwise than as specifically described herein without departing form the spirit and scope thereof.

What is claimed is:

1. A method of making a dual damascene structure comprising the steps of:

a) forming a layer of sacrificial material on a semiconductor substrate including at least one conductive region formed therein;

b) patterning the layer of sacrificial material to provide at least one stud over the conductive region;

c) forming an intermetal dielectric layer on the semiconductor substrate surrounding the at least one stud;

d) forming a conductive line opening in the intermetal dielectric layer, a portion of the at least one stud being exposed within the opening;

e) removing the at least one stud from the intermetal dielectric layer by etching the at least one stud with BHF to provide a via for the dual damascene structure; and f) depositing a conductive material within the via.

2. The method of claim 1 wherein the layer of sacrificial material has a higher etch rate than the intermetal dielectric layer.

3. The method of claim 1 wherein the layer of sacrificial material is made from a material selected from the group consisting of flowable oxide, CVD oxide, BSG.

4. The method of claim 1 wherein the intermetal dielectric layer is made from a material selected from the group consisting of organically doped CVD oxide, CVD oxide and silicon-containing organic material.

5. The method of claim 1 further comprising the step of planarizing the intermetal dielectric layer prior to forming the conductive line opening.

6. The method of claim 1 wherein the conductive material is elected from the group consisting of W and Al.

* * * * *